(12) United States Patent
Cheng et al.

(10) Patent No.: US 8,569,868 B2
(45) Date of Patent: Oct. 29, 2013

(54) DEVICE HAVING AND METHOD FOR FORMING FINS WITH MULTIPLE WIDTHS

(75) Inventors: Kangguo Cheng, Albany, NY (US);
Bruce B. Doris, Albany, NY (US);
Steven J. Holmes, Hopewell Junction, VT (US); Xuefeng Hua, Guilderland, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,296

(22) Filed: Jul. 18, 2012

(65) Prior Publication Data

US 2012/0280365 A1 Nov. 8, 2012

Related U.S. Application Data

(62) Division of application No. 12/614,986, filed on Nov. 9, 2009, now Pat. No. 8,324,036.

(51) Int. Cl.
*H01L 29/06* (2006.01)

(52) U.S. Cl.
USPC ............ 257/618; 438/165; 438/265; 438/685

(58) Field of Classification Search
USPC ......................................... 438/265, 685, 165
See application file for complete search history.

(56) References Cited

U.S. PATENT DOCUMENTS

| 6,492,212 B1 | 12/2002 | Ieong et al. |
| 7,265,059 B2 | 9/2007 | Rao et al. |
| 2007/0069293 A1 * | 3/2007 | Kavalieros et al. ........... 257/350 |

* cited by examiner

*Primary Examiner* — Eva Yan Montalvo
(74) *Attorney, Agent, or Firm* — Tutunjian & Bitetto, P.C.; Louis Percello

(57) ABSTRACT

A structure for a semiconductor device is disclosed. The structure includes a first feature and a second feature. The first feature and the second feature are formed simultaneously in a single etch process from a same monolithic substrate layer and are integrally and continuously connected to each other. The first feature has a width dimension of less than a minimum feature size achievable by lithography and the second feature has a width dimension of at least equal to a minimum feature size achievable by lithography.

10 Claims, 7 Drawing Sheets

DEVICE HAVING AND METHOD FOR FORMING FINS WITH MULTIPLE WIDTHS

RELATED APPLICATION INFORMATION

This application is a Divisional application of co-pending U.S. patent application Ser. No. 12/614,986 filed on Nov. 9, 2009, incorporated herein by reference in its entirety.

BACKGROUND

1. Technical Field

The present invention relates to semiconductor processing and more particularly to fabrication of components where multiple widths are formed simultaneously.

2. Description of the Related Art

Vertically disposed transistors formed on fins or fin field effect transistors (FinFETs) have been emerging as a promising new approach for continued scaling of complementary metal oxide semiconductor (CMOS) technology. Sidewall spacer imaging transfer (SIT) is one method for forming narrow fins beyond the printing capability of optical lithography. Conventional SIT methods result in fins with a same width across the chip. Some applications, however, require fins with different widths on the same chip. For example, various finFET devices on the same chip may require different fin widths for different threshold voltages. In another example, finFET devices may be formed on the same chip with other devices such as tri-gate devices or planar devices which require different fin widths from the fin width for finFET devices.

U.S. Pat. No. 6,492,212 employs an extra mask 215 to cover some spacers while exposing and trimming other spacers. However, this requires many lithographic steps and increased process complexity, cost, non-uniformity, overlay issues, defect magnification by spacers, etc. While U.S. Pat. No. 6,492,212 discloses a method for forming fins with different widths by using sidewall spacer imaging transfer, after forming the sidewall spacers 214 on dummy mandrels 212, an extra mask 215 is used to cover spacers in some regions while exposing spacers in other regions. Spacers not covered by mask 215 are then trimmed to a thickness less the spacer thickness is covered by the mask 215. U.S. Pat. No. 6,492,212 requires an additional mask for each variation of fin width. For example, three additional masks are needed in order to form fins with four different widths. Additional masks not only add process complexity, but also increase process cost. Moreover, this method introduces non-uniformity issues (e.g., variability in spacer trimming, different spacer heights after some spacers are trimmed, overlay issues, etc.).

U.S. Pat. No. 7,265,059 also involves process complexity and cost, severe defect magnification by spacers, etc. U.S. Pat. No. 7,265,059 discloses another method for forming fins with different widths by using dual spacers. Dual spacers 315 and 417 are formed. The spacer 315 is then removed, leaving a narrow pattern 417 and a wide pattern 209 for forming fins with different widths. The two spacer process adds complexity and increases process cost. Moreover, the 'defect magnification' issue in spacer imaging transfer process is more severe due to the two spacer process.

SUMMARY

A method for fabrication of features for an integrated circuit includes patterning a mandrel layer to include structures having at least one width on a surface of an integrated circuit device. Exposed sidewalls of the structures are reacted to integrally form a new compound in the sidewalls such that the new compound extends into the exposed sidewalls by a controlled amount to form pillars. One or more layers below the pillars are etched using the pillars as an etch mask to form features for an integrated circuit device.

A method for fabrication of features for an integrated circuit, comprising forming a mandrel layer on a base layer; forming a cap layer on the mandrel layer; patterning the cap layer to form a mandrel mask; etching the mandrel layer to form mandrels having two or more widths; thermally reacting exposed sidewalls of the mandrels with a reactant to integrally form a new compound in the sidewalls such that the new compound extends into the exposed sidewalls by a controlled amount to form pillars; removing the cap layer; and etching one or more layers below the pillars using the pillars as an etch mask to form features for an integrated circuit device.

A structure for a semiconductor device includes a first feature and a second feature formed simultaneously in a single etch process from a same monolithic substrate layer, the first feature and the second feature being integrally and continuously connected to each other. The first feature has a width dimension of less than a minimum feature size achievable by lithography, and the second feature has a width dimension of at least equal to a minimum feature size achievable by lithography.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, methods and structures for forming fins with a plurality of different widths on a same chip are disclosed. The present embodiments provide the different widths using spacers but without the drawbacks of defect magnification, extra masking steps and other drawback of the prior art as described above. Fins are formed with multiple widths and with various shapes in accordance with useful embodiments.

It is to be understood that the present invention will be described in terms of a given illustrative architecture having a semiconductor-on-insulator (SOI) wafer; however, other architectures, structures, substrate materials and process features and steps may be varied within the scope of the present invention.

The architecture or device as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
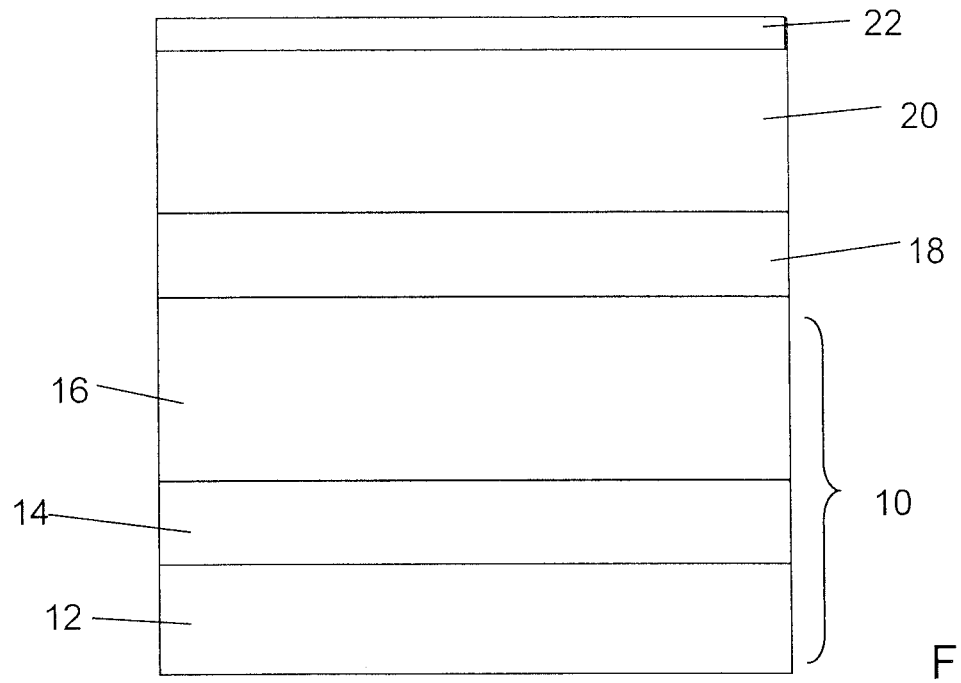
FIG. 1 is a cross-sectional view of a semiconductor wafer or device including a semiconductor-on-insulator substrate and having a pad layer, mandrel layer and cap layer formed thereon.

Referring now to the drawings in which like numerals represent the same or similar elements and initially to FIG. 1, a semiconductor-on-insulator substrate (SOI) 10 is shown having a silicon base layer 12 with an oxide layer (BOX layer) 14 and a silicon on oxide layer 16. It should be understood that the substrate 10 may include any suitable material and is not limited to SOI. For example, substrate 10 may include Gallium Arsenide, monocrystalline silicon, Germanium, or any other material or combination of materials. In some embodiments, the substrate 10 further comprises other features or structures that are formed on or in the semiconductor substrate in previous process steps. Further, the present principles may be applied to interlevel dielectric layers, metal layers or any other layer and particularly when sub-minimum features sized structures are useful.

A pad layer 18 is formed on layer 16. The pad layer 18 may include an oxide (e.g., silicon dioxide) or a nitride (e.g., silicon nitride). Other materials may also be employed, such as organic dielectrics, etc. A mandrel layer 20 is formed on the pad layer 18. The mandrel layer 20 may include silicon (e.g., polycrystalline silicon (polysilicon), amorphous silicon) or other suitable material. A cap layer 22 is formed on the mandrel layer 22 and may include a nitride (e.g., a silicon nitride) or other suitable material.

Figure 2:
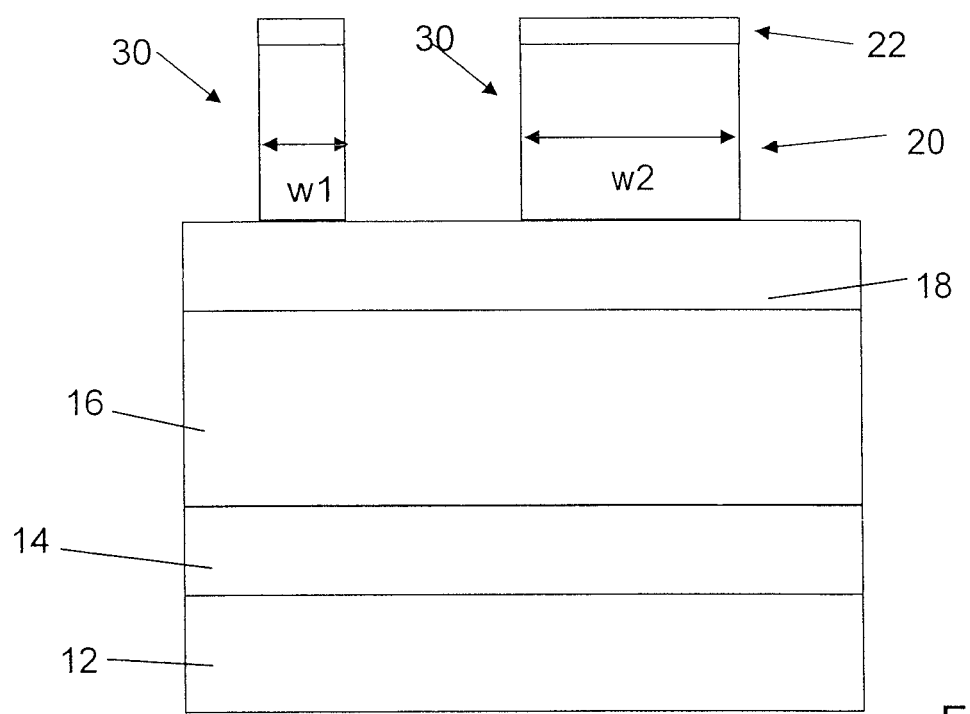
FIG. 2 is a cross-sectional view of the device of FIG. 1 showing the mandrel layer patterned in accordance with a mask formed in the cap layer to form mandrels of different widths.

Referring to FIG. 2, cap layer 22 and mandrel layer 20, are patterned and etched preferably using a lithographic process that may include a resist layer (not shown), lithographic patterning and etching of cap layer 22. Resist is removed and cap layer 22 is employed as a mask to etch the mandrel layer 20. The mandrel layer 20 is preferably etched selective to the cap layer 22 down to the pad layer 18. Mandrels 30 are formed by the etching process and may be formed having different widths. Mandrels 30 illustratively include two widths w1 and w2 although other widths and shapes may also be employed. In the present embodiment, mandrels 30 are defined with different widths where, e.g., a narrow fin w1 and a wide fin w2 have w1<w2.

Figure 3:
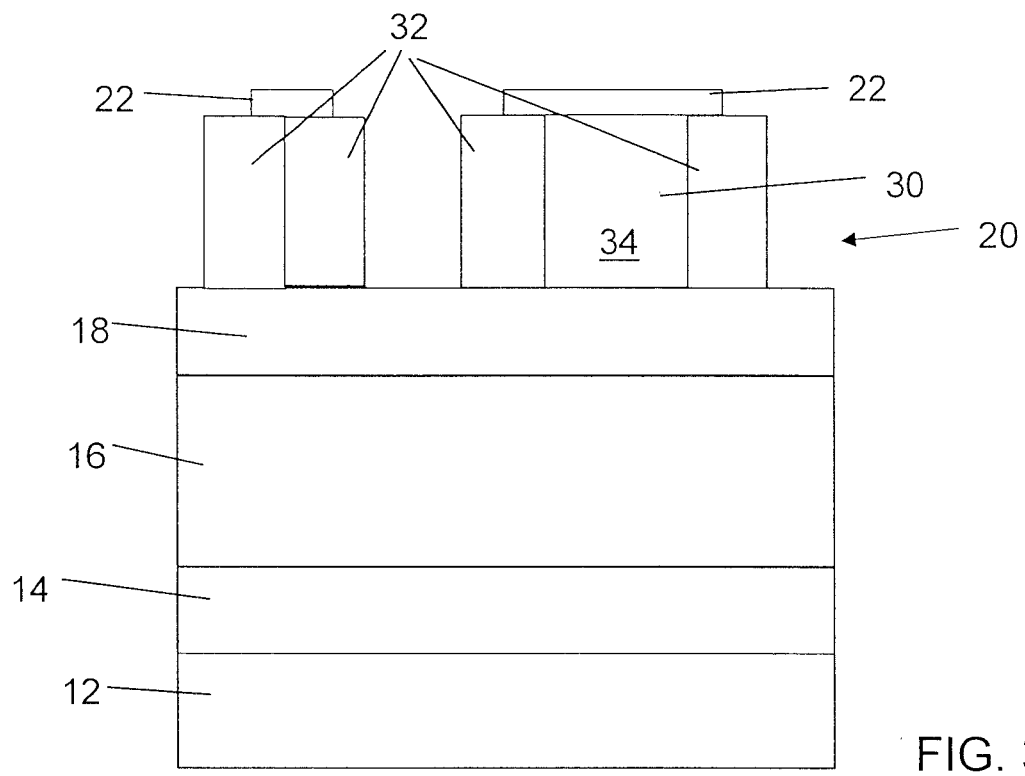
FIG. 3 is a cross-sectional view of the device of FIG. 2 showing the mandrels exposed to a thermal process to form pillars in the mandrels.

Referring to FIG. 3, the configuration as depicted in FIG. 2 is subjected to a thermal process to react with and expand portions of the mandrels 30. In one preferred process, thermal oxidation is performed to fully oxidize the exposed portions of the mandrels 30 not protected by cap layer 22. The thermal oxidation forms wide fins 32, which expand under oxidation resulting in oxide pillars wider than the originally narrow mandrels 30. Depending on a width of the original mandrel 30 different structures are created. For example, for the mandrel 30 with a width w1, the thermal oxidation causes a merging of the oxide regions to form a single oxide pillar. For the wider w2 mandrel 30, the oxide pillars are separated by material 34. Oxidation occurs from the sidewalls of the mandrels 30. The cap layer 22 prevents oxidation from the top of the mandrels 30.

Figure 4:
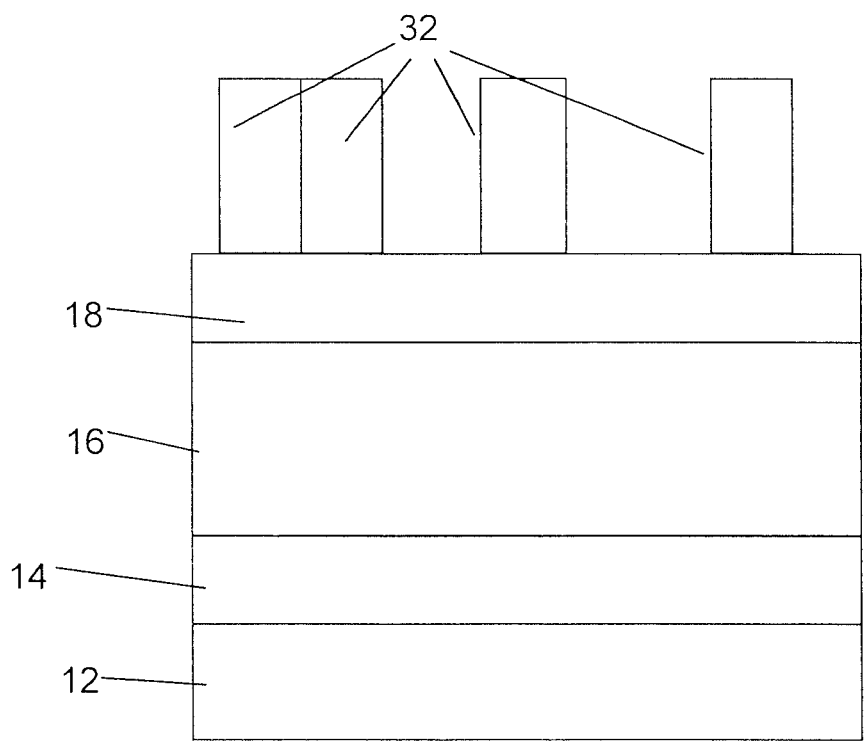
FIG. 4 is a cross-sectional view of the device of FIG. 3 showing the pillars forming a mask for processing underlying layers.

Referring to FIG. 4, the configuration as depicted in FIG. 3 is processed to remove the cap layer 22. This is preferably removed by an etching process which is selective to the thermally processed pillars 32 and the pad layer 18. Any remaining mandrels 30 are also removed selectively to the thermally processed pillars 32 and the pad layer 18. Since the thermal oxidation of e.g., polysilicon, results in a predictable expansion and stable oxide material, pillars 32 may be employed as an etch mask for the pad layer 18 and/or the silicon on insulator layer 16 or beyond.

Figure 5:
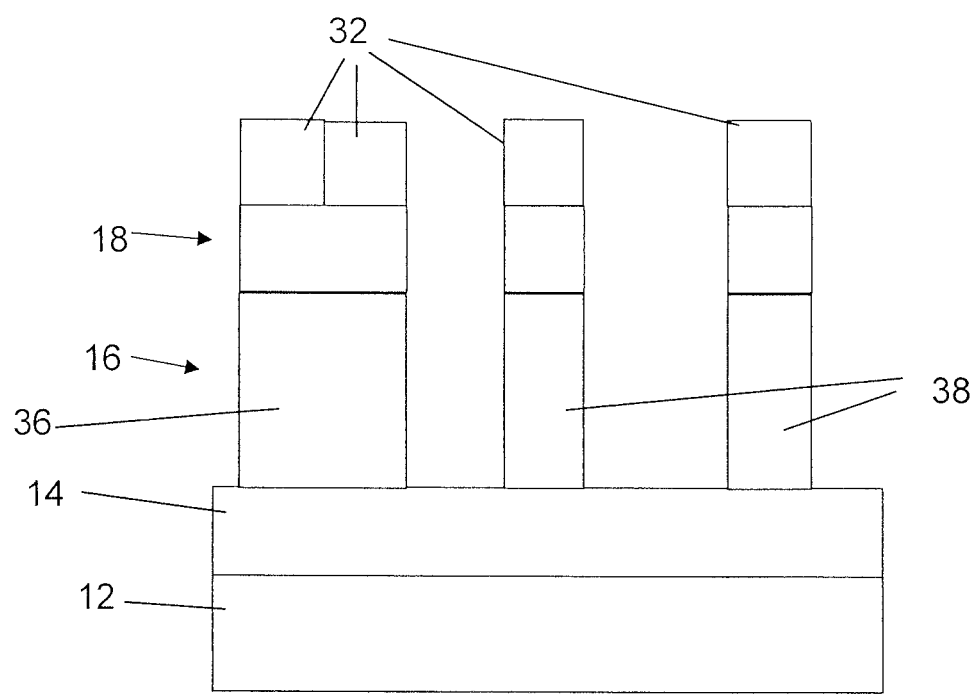
FIG. 5 is a cross-sectional view of the device of FIG. 4 showing the pillars employed as an etch mask to etch the pad layer and the substrate to form fins of different widths.

Referring to FIG. 5, a reactive ion etch (RIE) process is employed to open up the pad layer 18 and the underlying silicon on insulator layer 16. This etching forms silicon fins 36 and 38 of different widths. The fins 36 and 38 may be employed to form vertically disposed field effect transistors or finFETs or any other component. It should be understood that the selected widths, w1 and w2, are selected to create the widths of fins 36 and 38, respectively.

By employing the thermal processing, the size of the pillars 32 may be varied and controlled to any size including smaller than the minimum feature size. The width w2 of mandrel 30 results in widths of fins 38 that may be less than the minimum feature size. It should be noted that any sized pillars 32 may have been formed by controlling the parameters of the thermal processing. For example, by limiting the amount of time for oxidation, the size of pillars 32 may have been ¼, ⅛ or even smaller resulting in smaller fins 38. It should also be noted that the pillar (32) sizes need not be limited to integer fractions of the minimum feature size as any size can be achieve in accordance with the thermal processing step.

Figure 6:
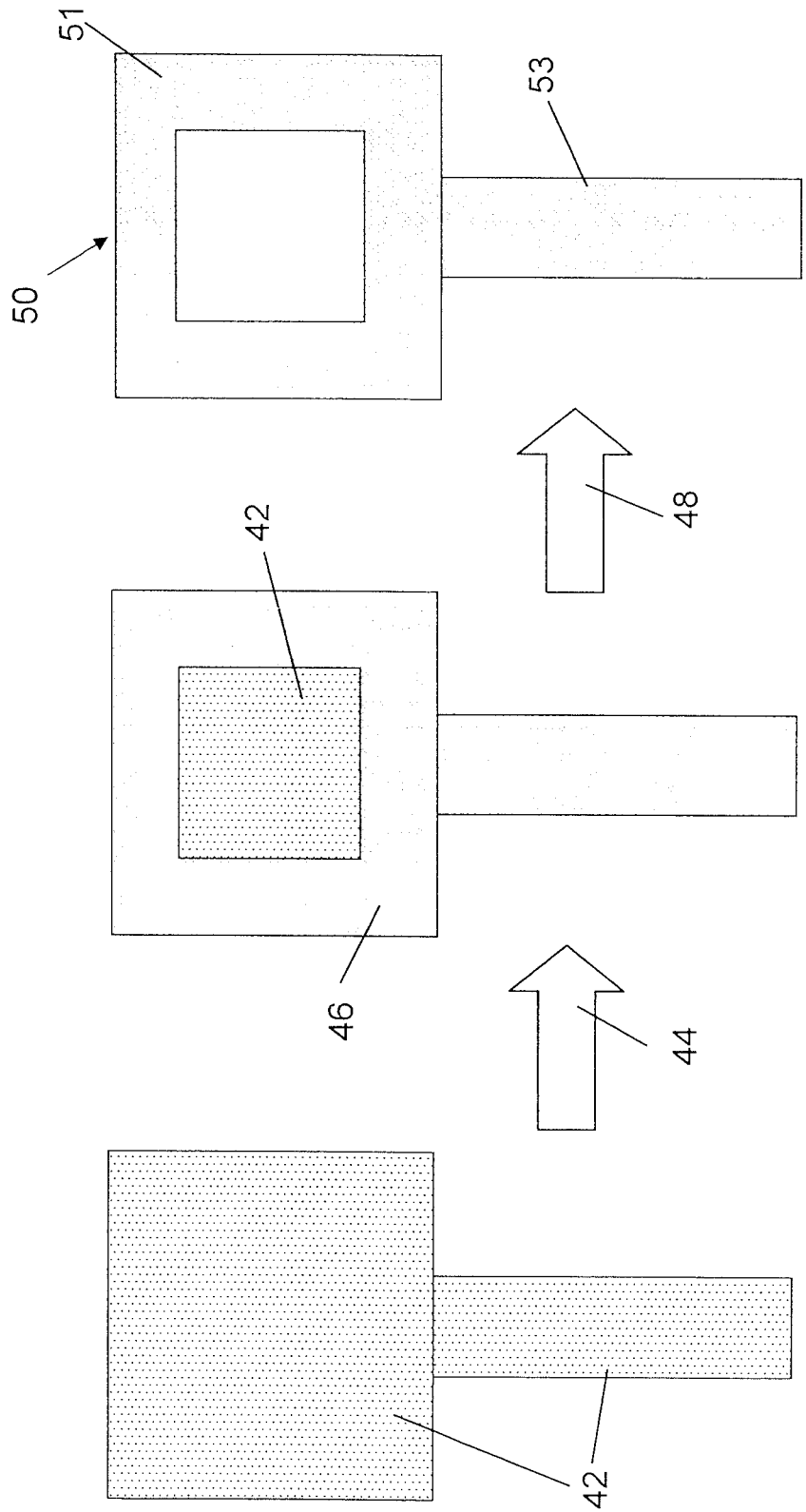
FIG. 6 is a diagram showing process steps to illustratively employ the present principles in an arbitrary pattern.

Referring to FIG. 6, the present principles provide much flexibility in integrated circuit processing. In one embodiment, a mandrel layer 42 may be patterned into any number of shapes and subjected to thermal processing 44. In one example, the mandrel layer 42 may include polysilicon, and the thermal processing includes an oxidation process such that the polysilicon exposed to oxygen reacts to form silicon dioxide (oxide).

After thermal processing a reacted material 46 (such as an oxide) formed, an etching process 48 removes any unreacted portions of the mandrel layer 42 leaving a customized mask 50 for etching underlying layers. It should be understood that the mask 50 depicted is for illustration purposes only. Any number of different configurations may be employed in accordance with the present principles. For example, a ring portion 51 or bar portion 53 may be formed with a width dimension of less than a minimum feature size obtained by lithography while the other of the bar portion 53 and the ring portion may be greater than the minimum feature size. Advantageously, the ring portion (e.g., a first feature) is continuous and integrally formed with the bar portion 53 (second feature). When an underlying layer is etched using the ring and bar mask 51 and 53 in a single etch process, a semiconductor substrate or other layer is formed with an integral features where the integral features may have different widths (e.g., one less than and one equal to or greater than a minimum feature size) and remain connected. It should be understood that the first and second features may include other shapes and dimensions, and other combinations and widths are also contemplated.

Figure 7:
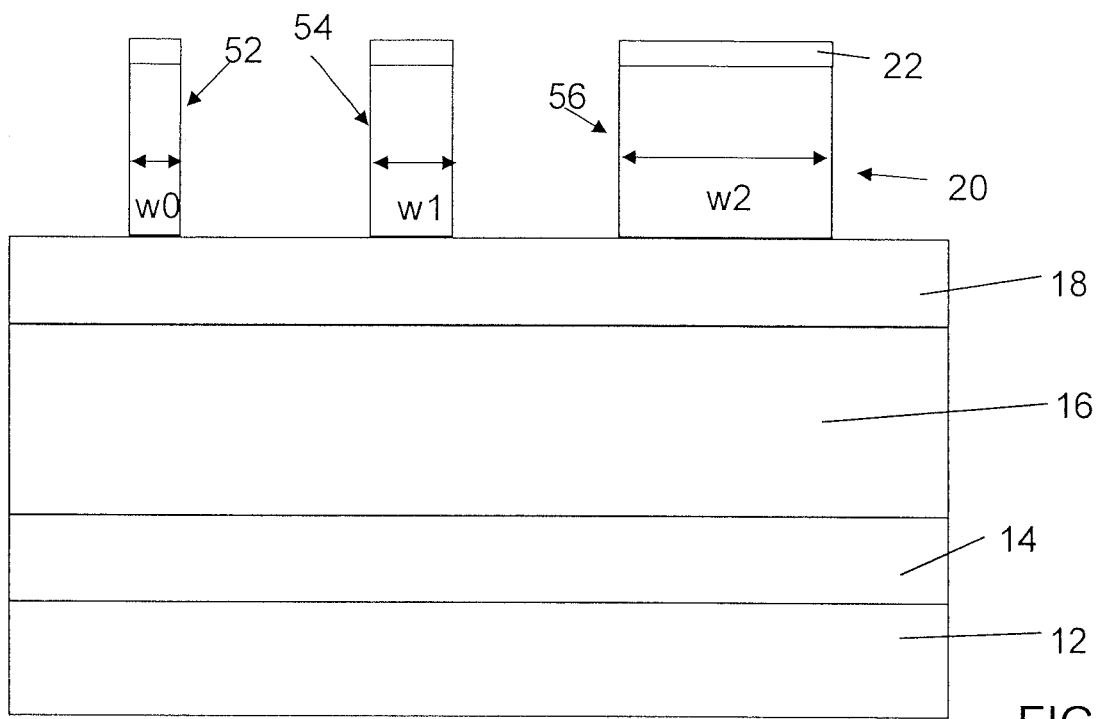
FIG. 7 is a cross-sectional view of the device of FIG. 1 showing the mandrel layer patterned in accordance with a mask formed in the cap layer to form mandrels of at least three different widths.

Referring to FIG. 7, the configuration of FIG. 1 is patterned using lithographic processing. A resist layer is formed, developed and employed to open up the mask layer and perhaps mandrels 52, 54 and 58. Alternately, after patterning, cap layer 22 may be employed as an etch mask to etch the mandrel layer 20. In this structure three different widths are provided for mandrels 52, 54 and 58, e.g., w0, w1 and w2, respectively (e.g., w0<w1<w2). A greater number of widths may also be employed.

Figure 8:
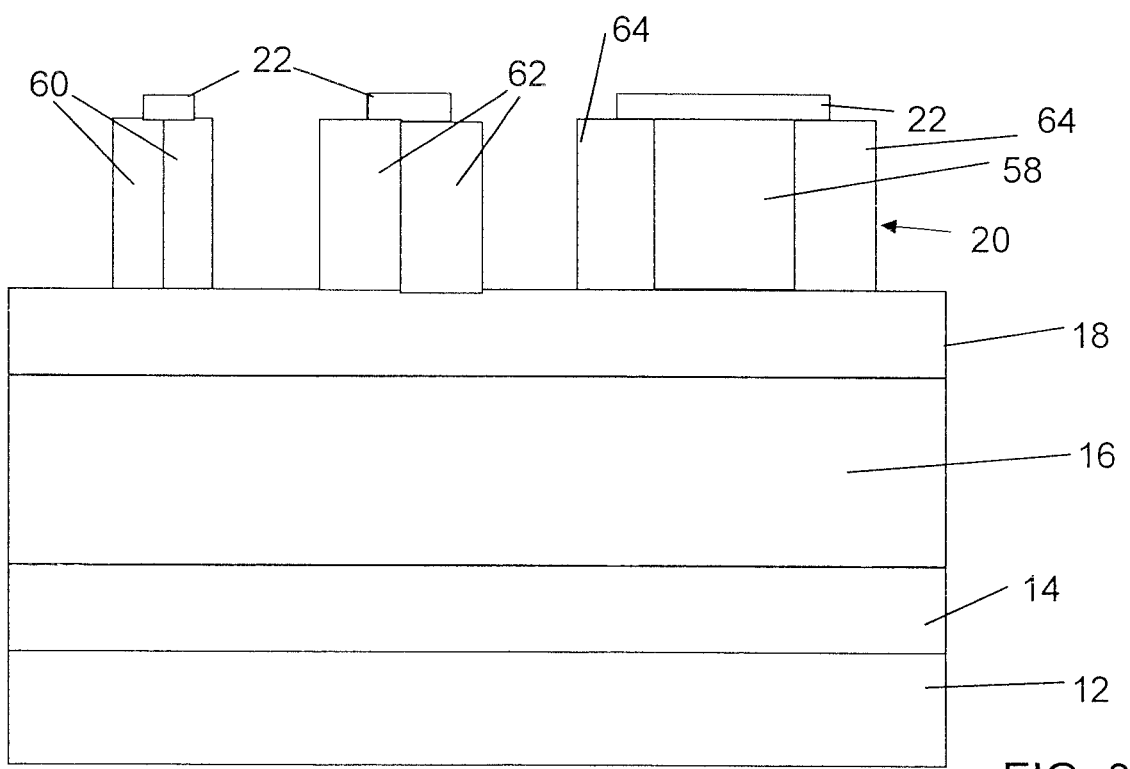
FIG. 8 is a cross-sectional view of the device of FIG. 7 showing the mandrels exposed to a thermal process to form pillars in the mandrels.

Referring to FIG. 8, thermal processing is performed on the configuration of FIG. 7 to provide the configuration of FIG. 8. In one embodiment, the mandrel layer 20 includes polysilicon and the thermal processing includes oxidation of the polysilicon. In this embodiment, the thermal oxidation fully oxidizes two narrow fins 60 and two wider fins 64 and partially oxidizes widest fins 64. The oxidation results in an expansion of the material which can extend beyond the remaining portions of the cap layer 22. Cap layer 22 protects the top surface of each fin from oxidation during the thermal processing.

Figure 9:
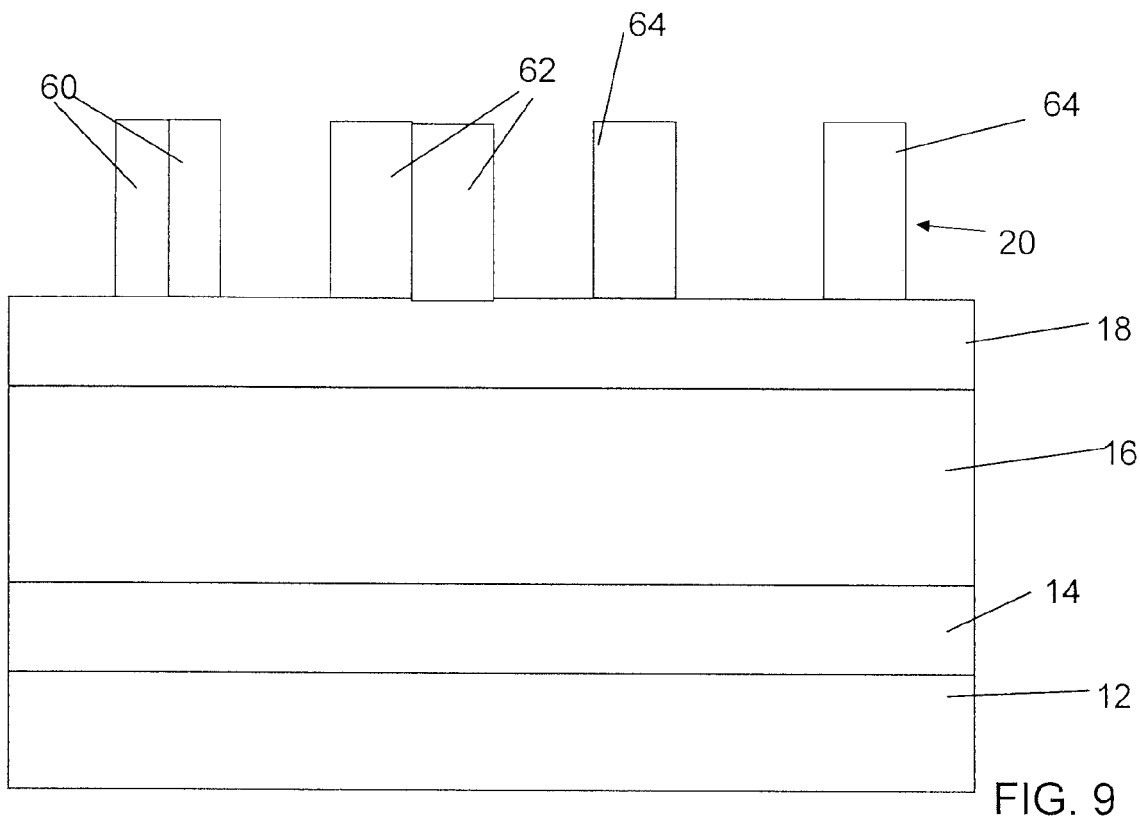
FIG. 9 is a cross-sectional view of the device of FIG. 8 showing the pillars forming a mask for processing underlying layers.

Referring to FIG. 9, the cap layer 22 is removed. Remaining portions of mandrels 54 are also removed. Pillars or fins of different sizes (60, 62 and 64) are left behind which are employed as a mask for further etching of layers below the pillars 60, 62 and 64.

Figure 10:
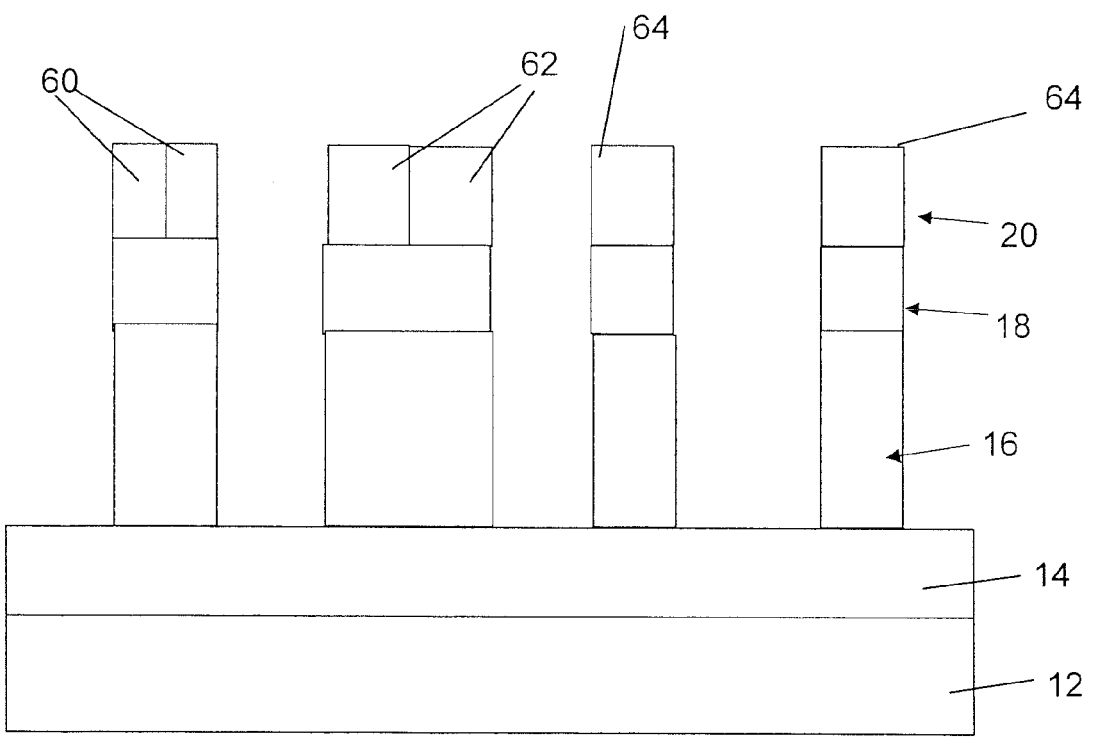
FIG. 10 is a cross-sectional view of the device of FIG. 9 showing the pillars employed as an etch mask to etch the pad layer and the substrate to form fins of different widths.

Referring to FIG. 10, the pattern of the pillars 60, 62, and 64 is transferred into pad layer 18 and/or silicon on insulator layer 16 to form fins 70, 72, 74 with different widths. The fins 70, 72 and 74 may be employed to form vertically disposed field effect transistors or finFETs or any other component. It should be understood that the selected widths, w0, w1 and w2, are selected to create the widths of fins 70, 72 and 74, respectively. A minimum feature sized width, e.g., w0, may include the smallest possible feature achievable through lithographic processing. This results in a fin 70 having a width of approximately the minimum feature size or smaller.

By employing the thermal processing, the size of the pillars 60, 62 and 64 may be varied and controlled to any size including smaller than the minimum feature size. It should be noted that any sized pillars 60, 62 and 64 may have been formed by controlling the parameters of the thermal processing. For example, by limiting the amount of time for oxidation, the size of pillars 60, 62 and 64 may have been ¼, ⅛ or even smaller resulting in smaller fins. It should also be noted that the pillar sizes need not be limited to integer fractions of the minimum feature size as any size can be achieve in accordance with the thermal processing step.

In one embodiment, the cap layer 22 may be processed to create an etch mask that provides mandrels that are less than the minimum feature size. In that case, additional processing steps may be employed, such as employing spacers to define sub-minimum feature sized masks resulting in pillars and fins of less than the minimum feature size. Note that multiple sized fins 70, 72 and 74 are simultaneously formed without adding resist masks and lithographic steps to differentiate between different sized components. Further, spacer defect magnification is avoided. The present principles provide a simpler and more controllable process, which has better scalability and no defect magnification issue.

Figure 11:
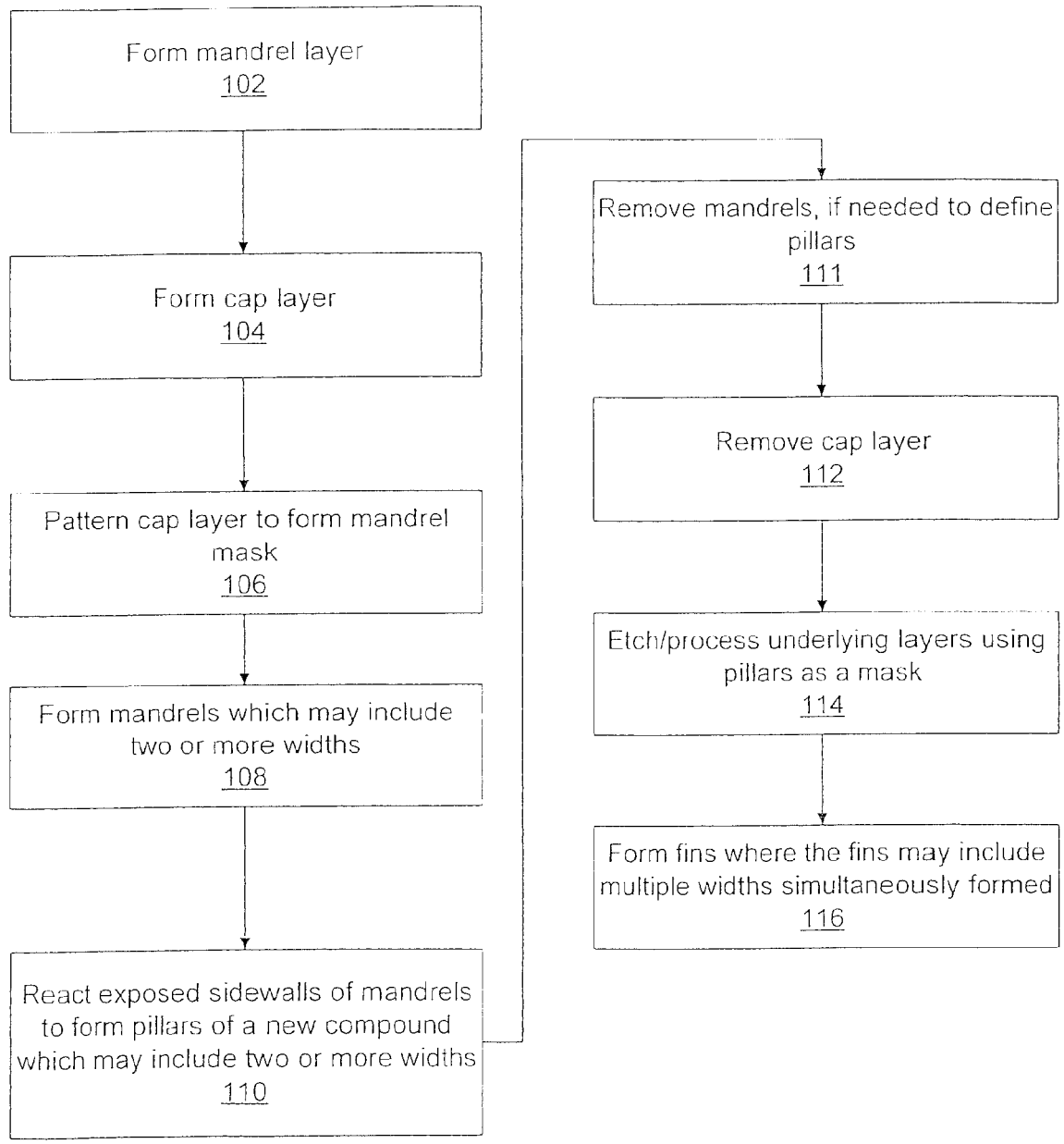
FIG. 11 is a flow diagram showing an illustrative method in accordance with the present principles.

Referring to FIG. 11, a method for fabrication of features for an integrated circuit is illustratively depicted. In block 102, a mandrel layer is formed on a base layer. The base layer may include a semiconductor substrate, an interlevel layer or any other layers. In block 104, a cap layer is formed on the mandrel layer. In block 106, the cap layer is patterned to form a mandrel mask. This may include using a lithographic patterning process of other process. In block 108, the mandrel layer is etched to form mandrels having two or more widths.

In block 110, exposed sidewalls of the mandrels are reacted with a reactant to integrally form a new compound in the sidewalls such that the new compound extends into the exposed sidewalls by a controlled amount to foam pillars. The reaction may include oxidation, ion implantation, or other chemical reactions. The new compound may include an oxide of the mandrel material. The oxide expands into the sidewalls and may meet in the middle. The thermal process is controlled to determine the extent of the width of the mandrel that is consumed. This makes the width of the new compound very controllable and very flexible. The reaction of the sidewalls of the mandrels may be continued until at least some of the mandrels completely include the new compound and/or until at least some of the mandrels include material remaining from the mandrel layer and the new compound. In the later case, the material from the mandrel layer is removed to define the pillars in block 111. The pillars may form a mask feature having a width of a less than a minimum feature size achievable by lithography.

In block 112, the cap layer is removed. The cap layer (e.g., nitride) is maintained to protect a top surface of the mandrels during the reactive processing. In block 114, one or more layers below the pillars is etched or processed using the pillars as a mask to form features for an integrated circuit device. In block 116, the etching of the one or more layers below the pillars may include forming fins in the substrate below the pillars. The fins may be employed to form vertical transistors or may be employed for further processing of layers below the fins. The fins preferably include a width of less than a minimum feature size achievable with lithography. The fins may include at least three different widths formed simultaneously.

Having described preferred embodiments of a device having and method for forming fins with multiple widths (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A structure for a semiconductor device, comprising:
   a first feature and a second feature formed simultaneously in a single etch process from a same monolithic substrate layer, the first feature and the second feature being integrally, physically and directly connected to each other; and
   the first feature having a width dimension of less than a minimum feature size achievable by lithography,
   the second feature having a width dimension of at least equal to a minimum feature size achievable by lithography.

2. The structure of claim 1, wherein the semiconductor device is a transistor device and wherein at least one of the first feature or the second feature is a fin of the transistor device.

3. The structure of claim 1, wherein the first and second features are in a metal layer of the semiconductor device.

4. The structure of claim 1, wherein the first and second features are in an interlevel dielectric layer of the semiconductor device.

5. The structure of claim 1, wherein the first feature is a bar feature.

6. The structure of claim 1, wherein the second feature is a ring feature.

7. The structure of claim 1, wherein the first feature is a ring feature.

8. The structure of claim 1, wherein the second feature is a bar feature.

9. A structure for a semiconductor device, comprising:
   a first feature and a second feature formed simultaneously in a single etch process from a same monolithic substrate layer, the first feature and the second feature being integrally and continuously connected to each other; and
   the first feature having a width dimension of less than a minimum feature size achievable by lithography,
   the second feature having a width dimension of at least equal to a minimum feature size achievable by lithography,
   wherein the first and second features are in a metal layer of the semiconductor device.

10. A structure for a semiconductor device, comprising:
    a first feature and a second feature formed simultaneously in a single etch process from a same monolithic substrate layer, the first feature and the second feature being integrally and continuously connected to each other; and
    the first feature having a width dimension of less than a minimum feature size achievable by lithography,
    the second feature having a width dimension of at least equal to a minimum feature size achievable by lithography,
    wherein the first and second features are in an interlevel dielectric layer of the semiconductor device.

* * * * *